United States Patent
Chou et al.

(10) Patent No.: US 11,183,447 B2
(45) Date of Patent: Nov. 23, 2021

(54) FLIP-CHIP PACKAGE SUBSTRATE AND METHOD FOR FABRICATING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 17/020,984

(22) Filed: Sep. 15, 2020

(65) Prior Publication Data

US 2021/0098351 A1   Apr. 1, 2021

(51) Int. Cl.
*H05K 3/46*       (2006.01)
*H01L 23/498*     (2006.01)
*H01L 23/00*      (2006.01)
*H01L 21/48*      (2006.01)
*H05K 1/03*       (2006.01)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49838* (2013.01); *H01L 23/49894* (2013.01); *H01L 23/562* (2013.01); *H05K 1/0306* (2013.01); *H05K 3/4605* (2013.01); *H01L 23/49816* (2013.01); *H05K 2201/10674* (2013.01)

(58) Field of Classification Search
CPC ............... H05K 1/0306; H05K 3/4605; H05K 2201/10674
USPC ......................................................... 174/255
See application file for complete search history.

(56) References Cited

U.S. PATENT DOCUMENTS

2007/0249155 A1* 10/2007 Chen .................... H01L 21/4857
                                                      438/618
2011/0031606 A1*  2/2011 Chen ........................ H01L 24/24
                                                      257/690

\* cited by examiner

*Primary Examiner* — Sherman Ng
(74) *Attorney, Agent, or Firm* — Amin, Turocy & Watson, LLP (57) ABSTRACT

A flip-chip package substrate and a method for fabricating the same are provided. An insulation layer is formed on two opposing sides of a middle layer to form a composite core structure and increase the rigidity of the flip-chip package substrate. Therefore, the core structure can be made thinner. The conductive structures can also have a smaller end size, and more conductive points can be disposed within a unit area. Therefore, a circuit structure can be produced that have a fine line pitch and a high wiring density, satisfy the packaging demands of highly integrated circuit/large size substrate, and avoid an electronic package from being warpage.

10 Claims, 8 Drawing Sheets

FLIP-CHIP PACKAGE SUBSTRATE AND METHOD FOR FABRICATING THE SAME

CROSS-REFERENCE TO RELATED APPLICATIONS

This application claims priority to Taiwan Application Ser. No. 108135196, filed on Sep. 27, 2019. The entirety of the application is hereby incorporated by reference herein and made a part of this specification.

BACKGROUND

1. Technical Field

The present disclosure relates to package substrates, and, more particularly, to a flip-chip package substrate for semiconductor flip-chip packaging process and a method for fabricating the same.

2. Description of the Prior Art

With the rapid development of communication industry, fifth generation wireless (5G) communication, augmented reality (AR), virtual reality (VR) techniques come to the market in recent years. Accordingly, high-leveled semiconductor packaging techniques have to be developed in order to apply in semiconductor flip-chip packaging or multi chip packaging, such as artificial intelligence (AI) chips, high-leveled chips and multiple chips. As such, the package size is bound to become larger and larger, and the number of layers stacked is getting higher and higher, resulting in circuit design being designed towards high density, fine line spacing, high conductive points etc.

In order to coordinate with packages of highly integrated chips (e.g., AI chips) and to satisfy the requirement for a great number of conductive points and complex circuits, the size of the core structure of the current flip-chip package substrate packaged and applied in the high-leveled chips has to be thickened in order to prevent warpage from occurrence. However, the through holes of such a thick flip-chip package substrate have a large cross-sectional size, and the conductive points have a large pitch. As a result, in a unit area, the number of the conductive points and the circuit density are reduced, and the line pitch is increased.

Figure 1A:
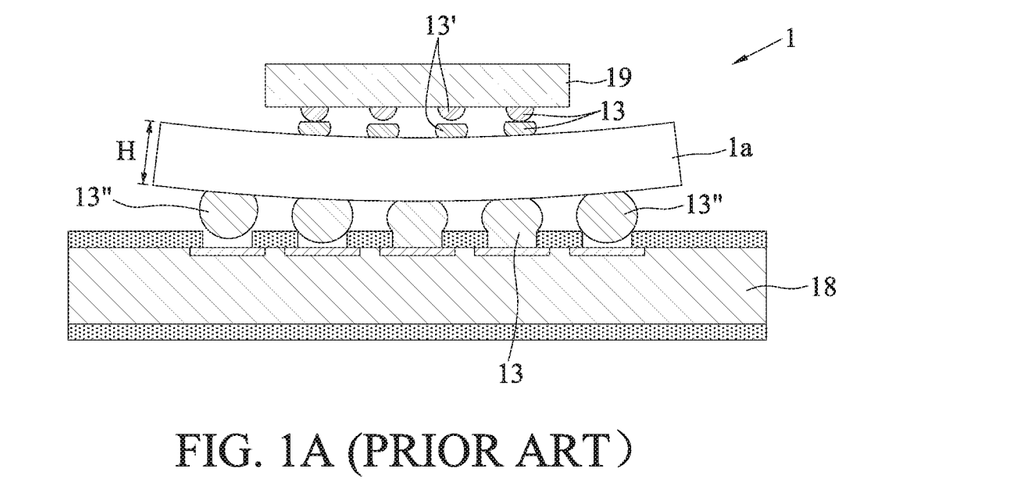
FIG. 1A is a cross-sectional view of an electronic device according to the prior art.
Figure 1B:
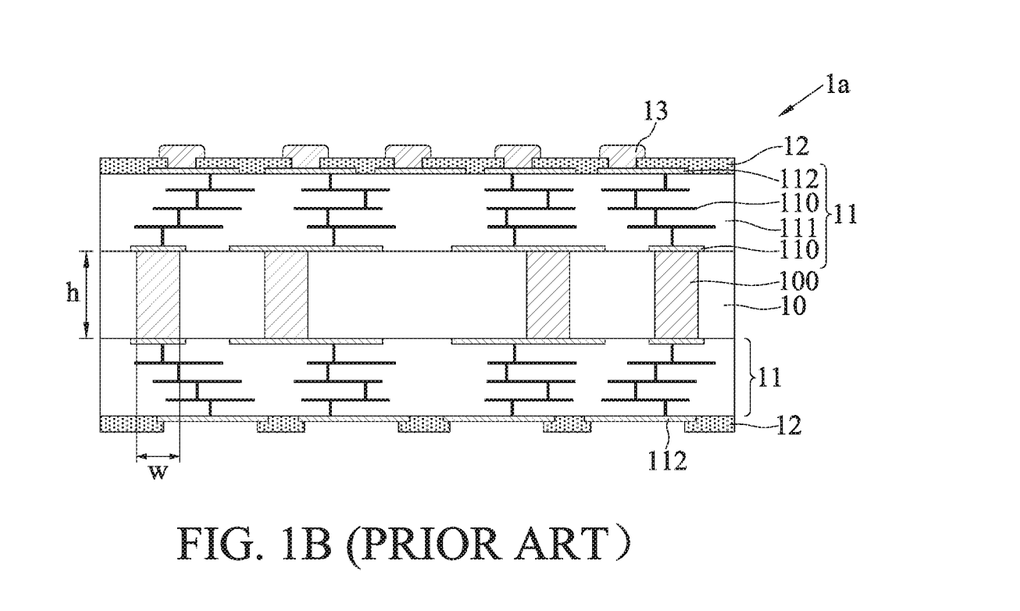
FIG. 1B is a cross-sectional view of a flip-chip package substrate according to the prior art.

Currently, flip-chip package substrates of 45×45 mm$^2$, 70×70 mm$^2$ and 80×80 mm$^2$ are popular in the art, and are used to carry artificial intelligence (AI) chips, high-leveled chips or multiple chips. As shown in FIG. 1A, an electronic device 1 comprises a circuit board 18, a flip-chip package substrate 1a of a large size disposed on the circuit board 18, and a highly integrated semiconductor chip 19 bonded onto the flip-chip package substrate 1a. As shown in FIG. 1B, the flip-chip package substrate 1a comprises a core structure 10, build-up structures 11 disposed on upper and lower sides of the core structure 10, respectively, and a solder resist layer 12 formed on the build-up structures 11. The core structure 10 has conductive vias 100 that electrically connect a circuit layer 110 of the build-up structures 11. The build-up structures 11 comprise a dielectric layer 111 encapsulating the circuit layer 110. The solder resist layer 12 is exposed from the outermost side of the circuit layers 110 of the build-up structures 11, to act as the conductive points 112. A solder material 13 bonds the circuit board 18 to the semiconductor chip 19.

In the core structure 10 of prior art, a substrate is composed of glass fiber and epoxy resin, such as Bismaleimide Triazine (BT) or flame retardant 5 (FR-5), and is drilled to form the conductive vias 100 by mechanical drilling, laser drilling or dual cone via drilling technique, and the conductive vias 100 are electroplated by a conductive layer and filled by a filler.

The flip-chip package substrate 1a of prior art has some drawbacks. The core structure 10 uses a substrate made of glass fiber and epoxy resin. The materials in each of the layers of the flip-chip package substrate 1a have inconsistent coefficients of thermal expansion (CTEs), and the flip-chip package substrate 1a is likely warpage during packaging and in poor connection with the semiconductor chip 19 (e.g., an upper solder material 13' shown in FIG. 1A is not connected or is broken) or with the circuit board 18 during soldering (e.g., a lower solder material 13" shown in FIG. 1A is not connected or is broken). The semiconductor chip 19 may be broken due to the uneven distribution of stress, and is malfunctioned electrically.

To address the above issues, the thickness h of the core structure 10 is thickened, for example, from 0.8 mm to 1.2 mm (or 1.6 mm), and the hole diameter w is increased accordingly, for example, from 0.1 mm to 0.2 mm, to improve the rigidity of the flip-chip package substrate 1a. However, doing so causes some problems as follows.

Firstly, the thickening of the core structure 10 is contradictory to the compact-size and low-profile requirements for modern packages.

Secondly, the number of the conductive points 112 in a unit area is not increased. As a result of the thickening, the end size of the plurality of conductive vias 100 is increased (i.e., the hole diameter w is increased), and the pitch of the plurality of conductive vias 100 is increased accordingly, which reduces the number of the conductive points 112 in a unit area.

Thirdly, the circuit pitch is increased, and the circuit density is reduced. As a result of the thickening of the core structure 10, the plurality of conductive vias 100 have an increased end size and occupy more layout area, and the circuit layout area above the circuit layer 110 is reduced. Therefore, it is difficult to fabricate the circuit layer 110 of fine line pitch and high circuit density.

Fourthly, the conductive vias 100 are difficult to be electroplated and filled with a filler. As a result of the thickening of the core structure 10, the plurality of conductive vias 100 become deeper, and are hard to be electroplated and filled with a filler.

Fifthly, the conductive vias 100 have a high cost and are hard to be processed, as the core structure 10 is thickened. In the prior art, the core structure 10 is thickened by adding a dielectric material of a glass fiber cloth, in order to improve the warpage problem. However, when the conductive vias 100 are processed by laser or mechanical drilling on the glass fiber cloth, it is difficult to form the conductive vias 100 of a small end size, and the manufacturing cost is high.

Sixthly, the conductive resistance is increased, which results in poor electric characteristics. Since the thickness h of the core structure 10 is thickened, the overall thickness of the flip-chip package substrate 1a is increased accordingly. Therefore, the conductive path becomes longer (e.g., the conductive vias 100), the resistance becomes greater, and the electric characteristics become poorer.

Seventhly, the heat dissipating capability becomes poorer. As the core structure 10 becomes thicker, the entire flip-chip package substrate 1a becomes thicker. Therefore, the flip-chip package substrate 1a has poorer heat dissipating capability, which affects the overall performance and lifespan.

Therefore, how to solve the problems of the prior art is becoming an urgent issue in the art.

SUMMARY

In view of the problems of the prior art, the present disclosure provides a flip-chip package substrate, comprising: a core structure having a first side, a second side opposing the first side, a middle layer, and an insulation layer bonded to two opposing sides of the middle layer and made of a different material from the middle layer; a plurality of conductive structures, each of which penetrating the middle layer and the insulation layer and being exposed from the first and second sides of the core structure; and a circuit structure formed on the first and second sides of the core structure in a dual-side built-up circuit manner and electrically connected to the conductive structures.

The present disclosure also provides a method for fabricating a flip-chip package substrate, comprising: providing a middle layer; bonding an insulation layer onto two opposing sides of the middle layer, respectively, allowing the middle layer and the insulation layer to act as a core structure that has a first side and a second side opposing the first side, wherein the middle layer is made of a different material from the insulation layer; forming in the core structure a plurality of conductive structures, each of which penetrating the middle layer and the insulation layer and being exposed from the first and second sides of the core structure; and forming on the first and second sides of the core structure a circuit structure in a dual-side built-up circuit manner, and electrically connecting the circuit structure to the conductive structures.

In an embodiment, the middle layer of the core structure is made of an insulative material, such as highly rigid Bismaleimide Triazine (BT) or flame retardant 5 (FR-5), which contains glass fiber.

In an embodiment, the insulation layer of the core structure is made of a highly rigid dielectric material, such as epoxy resin or Ajinomoto Build-up Film (ABF).

In an embodiment, the flip-chip package substrate further comprises a strengthening structure formed on the circuit structure on at least one of the first side and the second side of the core structure. In another embodiment, the strengthening structure comprises a rigid portion and an insulation portion bonding the rigid portion onto the circuit structure.

In the flip-chip package substrate and the method for fabricating the same according to the present disclosure, the insulation layer is formed on two opposing sides of the middle layer to form a composite core structure to increase the rigidity of the flip-chip package substrate. Compared with the prior art, the flip-chip package substrate according to the present disclosure can prevent warpage in a semiconductor packaging process, have conductive structures that have a small end size, more conductive points in a unit area, and a circuit structure that has a fine line pitch and a high wiring density, and meet the package demands for highly integrated chips.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

The terminology used herein is for the purpose of describing particular devices and methods only and is not intended to be limiting of this disclosure. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

FIGS. 2A to 2E are cross-sectional views illustrating a method for fabricating flip-chip package substrates 2a and 2b of a first embodiment according to the present disclosure.

Figure 2A:
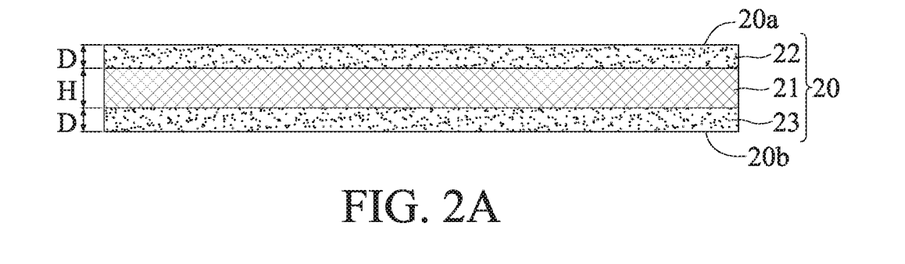
FIGS. 2A to 2E are cross-sectional views illustrating a method for fabricating a flip-chip package substrate of a first embodiment according to the present disclosure, wherein FIG. 2C' is a cross-sectional view of a portion of another aspect of FIG. 2C.

As shown in FIG. 2A, a core structure 20 having a first side 20a and a second side 20b opposing the first side 20a is provided.

In an embodiment, in the fabrication of the core structure 20, insulation layers 22 and 23 are compressed on two opposing sides of a middle layer 21, respectively, to allow the middle layer 21 and the insulation layers 22 and 23 to act as the core structure 20, and the surfaces of the insulation layers 22 and 23 define the first side 20a and the second side 20b, respectively.

In an embodiment, the middle layer 21 is made of an insulative material, such as a dielectric material. The dielectric material can be an organic resin containing no glass fiber or containing a filler (e.g., $SiO_2$ or glass fiber powder). In another embodiment, the organic dielectric material comprises a molding compound, an epoxy molding compound (EMC) or a primer. In yet another embodiment, the dielectric material is an insulative inorganic material, such as insulative oxide, nitride, an aluminum-containing material, or ceramics. In still another embodiment, the middle layer 21 is made of highly rigid Bismaleimide Triazine (BT) or FR-5 containing glass fiber.

In an embodiment, the insulation layers 22 and 23 are made of highly rigid ceramics (e.g., $Al_2O_3$ or AlN), plastic steel, carbon fiber, or an organic dielectric material, such as an organic adhesive material. In another embodiment, the organic dielectric material comprises a molding compound, an epoxy molding compound (EMC), a primer, or a filler of a high ratio ($SiO_2$-75% or more). In yet another embodiment, the insulation layers 22 and 23 are made of a highly rigid dielectric material, such as EMC or ABF. In still another embodiment, the insulation layers 22 and 23 are made of other materials.

In an embodiment, the middle layer 21 and the insulation layers 22 and 23 are made of different materials. In another embodiment, the insulation layers 22 and 23 are made of a molding compound or primer, which can overcome the warpage.

In an embodiment, the middle layer 21 has a thickness H of 0.2-0.6 mm. In another embodiment, the insulation layers have a thickness D of 0.1-0.3 mm.

Figure 2B:
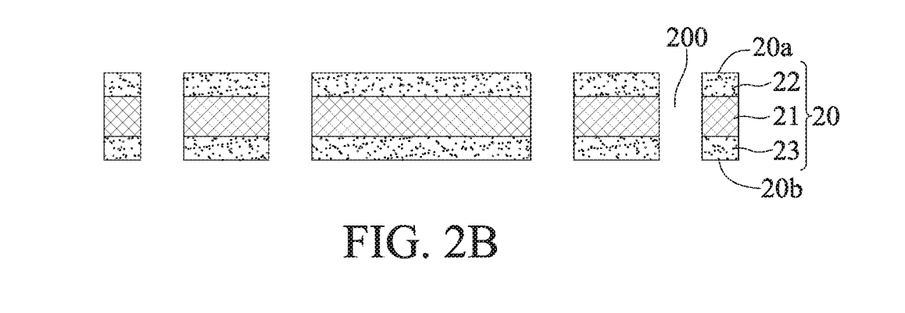

As shown in FIG. 2B, a patterning process is performed to form on the core structure 20a plurality of vias 200 in communication with the first side 20a and the second side 20b.

In an embodiment, the vias 200 are formed by mechanical drilling, laser drilling or other drilling techniques.

Figure 2C:
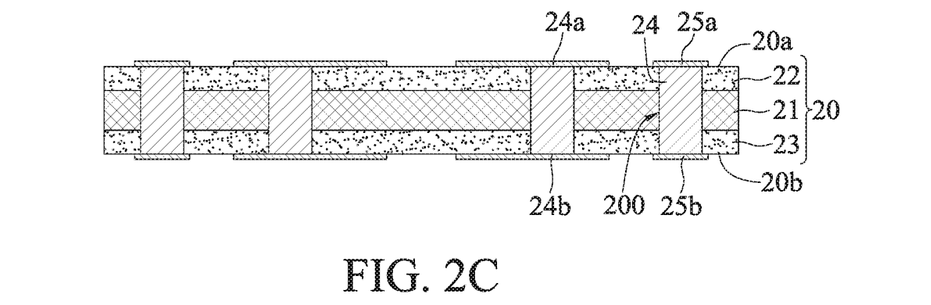

As shown in FIG. 2C, the plurality of vias 200 are electroplated, deposited or filled with a conductive material, such as solder paste and conductive resin, to form a plurality of conductive structures 24. The first and second sides 20a and 20b of the core structure 20 are electroplated at the same time or at different times to form circuit layers 25a and 25b, respectively, and the circuit layers 25a and 25b are electrically connected to the plurality of conductive structures 24.

Figure 5A:
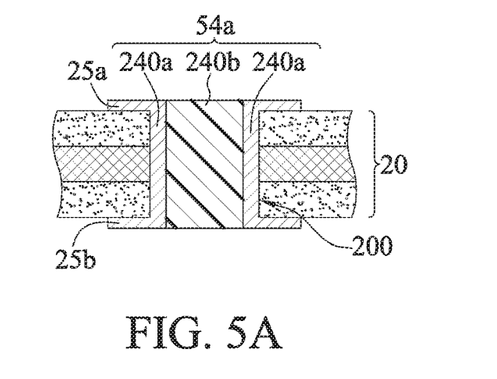
FIGS. 5A to 5H are cross-sectional views of a core structure of a flip-chip package substrate of different aspects according to the present disclosure.

In an embodiment, the conductive structures 24 are composed by a single pillar that has no circuit extending to a perimeter thereof. Each of the conductive structures 24 has opposing end surfaces 24a and 24b exposed from the first and second sides 20a and 20b of the core structure 20, respectively, and connected to the circuit layers 25a and 25b, respectively. In an embodiment, in the fabrication of the conductive structures 24 the vias 200 are electroplated and filled with a conductive material to form an integrated pillar (as shown in FIG. 2C). In another embodiment, a conductive material 240a is first formed on via walls of the vias 200, and then a filler 240b is filled in the vias 200 (e.g., the conductive structures 54a shown in FIG. 5A).

Figure 5B:
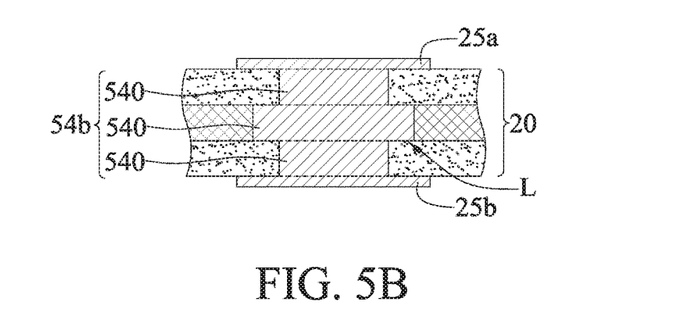
Figure 5C:
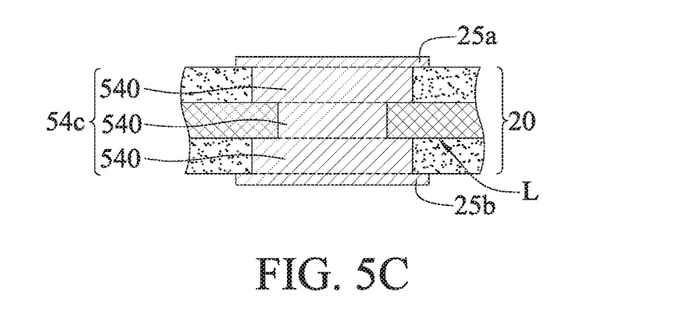
Figure 5D:
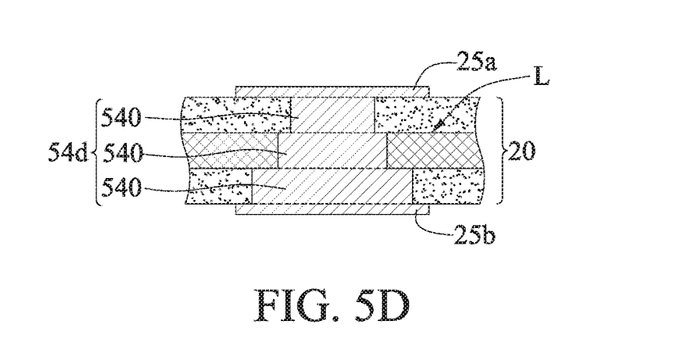

As shown in FIG. 2C', the conductive structures 24' are composed of a plurality of pillars 240 stacked on one another, and the vias 200 are formed by stacking the holes of the middle layer 21 with the holes of the insulation layers 22 and 23. In an embodiment, each of the end surfaces of the pillars 240 has the same size. In another embodiment, each of the end surfaces of the pillars 540 has different sizes (e.g., the conductive structures 54b, 54c and 54d shown in FIGS. 5B to 5D, respectively), and the intersections L of the end surfaces of each of the pillars 540 are concave-convex (as shown in FIGS. 5B and 5C) or in the shape of a staircase (as shown in FIG. 5D). In an embodiment, the conductive structures have a discontinuous periphery. In another embodiment, the number of layers stacked on the pillars and the form of the periphery of the pillars can vary on demands. In yet another embodiment, the pillars 240 in the middle layer 21 or the insulation layers 22, 23 can be further configured as a multi-stage pillar structure formed by stacking a plurality of pillars.

Figure 5E:
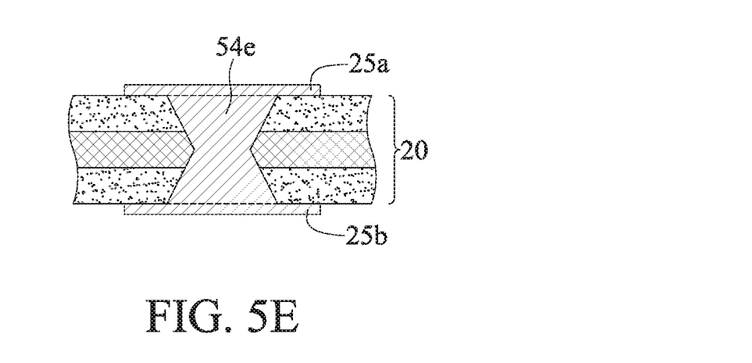
Figure 5F:
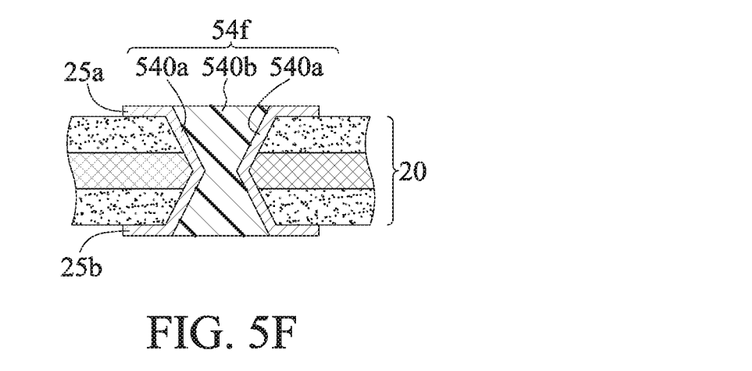
Figure 5G:
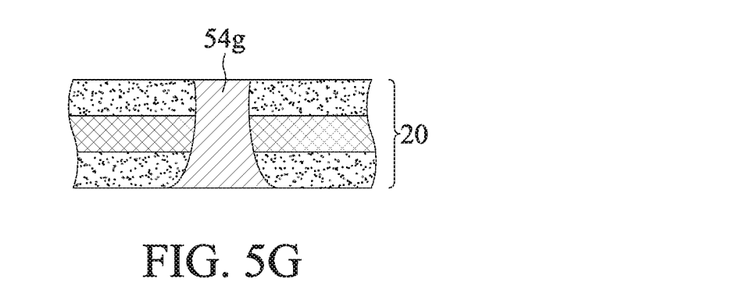
Figure 5H:
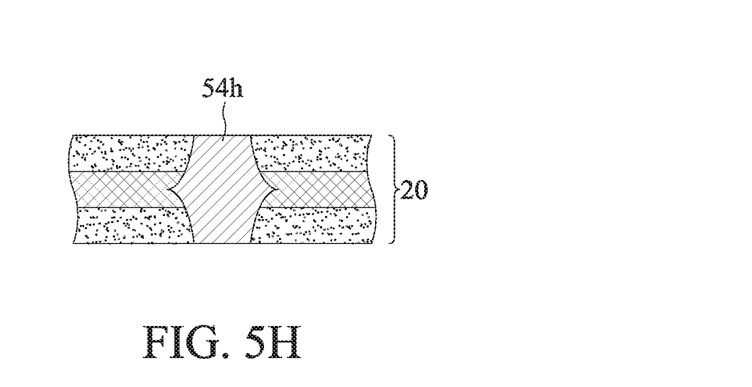

In an embodiment, the conductive structures have a continuous periphery, such as a flat oblique surface, flat straight surfaces of the conductive structures 24 and 24' shown in FIGS. 2C and 2C', respectively, dual-cone surfaces of the conductive structures 54e and 54f shown in FIGS. 5E and 5F, respectively, or arced surfaces of the conductive structures 54g and 54h shown in FIGS. 5G and 5H, respectively.

Figure 2D:
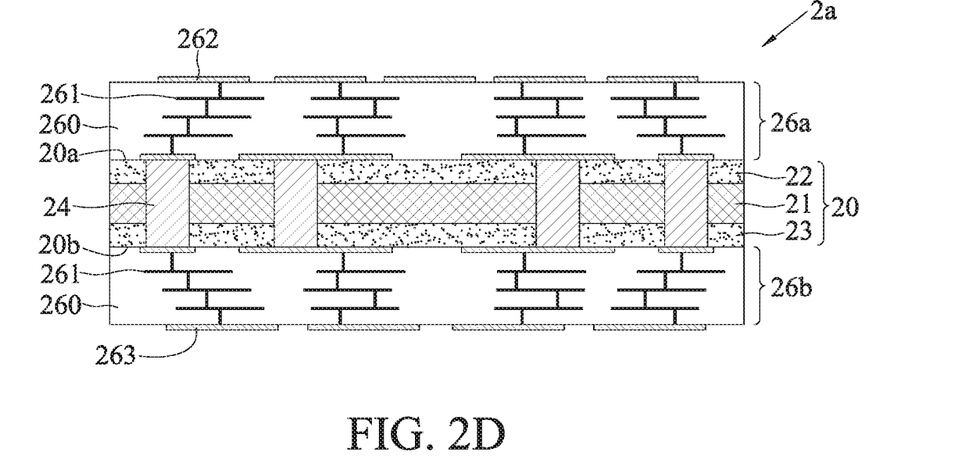

As shown in FIG. 2D, on the circuit layers 25a and 25b circuit structures 26a and 26b are formed in a dual-side built-up circuit manner on the first and second sides 20a and 20b of the core structure 20, respectively (i.e., the number of circuit layers being formed on demands), and electrically connected to the conductive structures 24. In an embodiment, on the first and second sides 20a and 20b of the core structure 20 the circuit structures 26a and 26b in the form of a build-up circuit are formed at the same time or at different times, respectively. Each of the circuit structures 26a and 26b comprises at least one dielectric layer 260 and a circuit layer 261 bonded to the dielectric layer 260. In an embodiment, the dielectric layer 260 is made of epoxy resin, such as Ajinomoto Build-up Film (ABF), prepreg, and EMC.

Figure 2E:
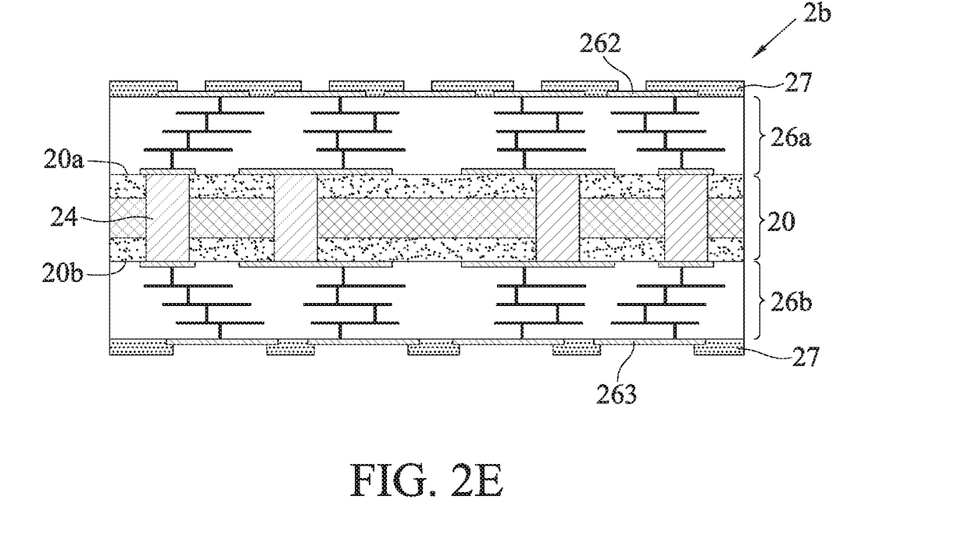

As shown in FIG. 2E, an insulation protection layer 27 is formed on the circuit structures 26a and 26b and exposed from the outermost side of the circuit layer 261 to be conductive pads 262 and 263.

In an embodiment, the insulation protection layer 27 is made of a solder resist material, such as photosensitive ink, ABF, and non-photosensitive dielectric material (e.g., EMC).

Figure 2F:
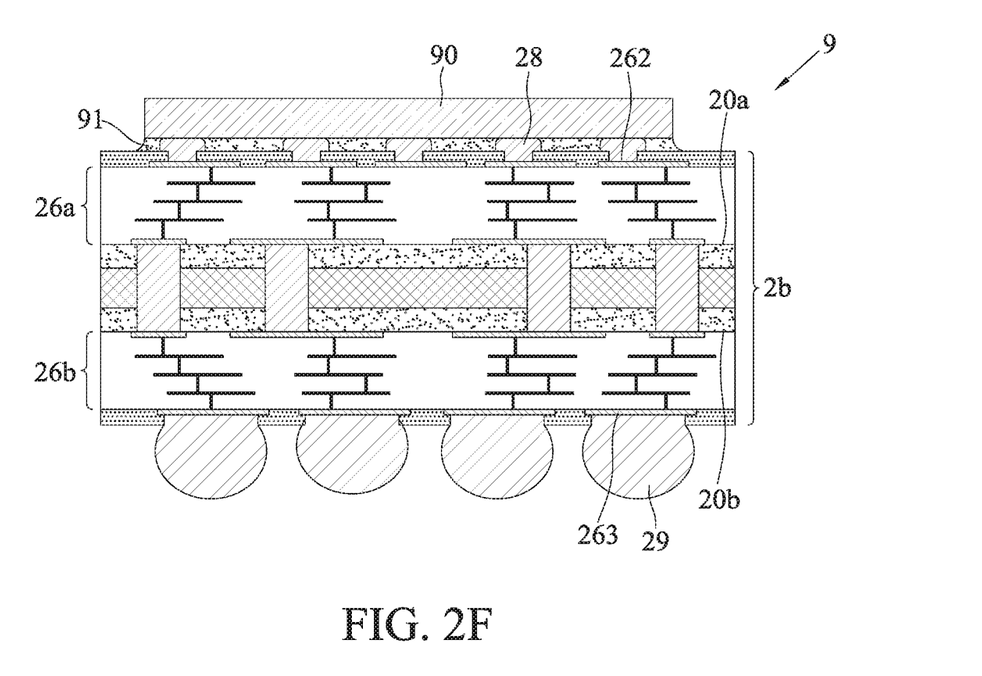
FIG. 2F is a cross-sectional view of an application of FIG. 2E.

As shown in FIG. 2F, at least one electronic component 90 is disposed via a conductive element 28 on the conductive pad 262 on one side of the flip-chip package substrates 2a and 2b, to form an electronic package 9. In an embodiment, a conductive element 29, such as a solder ball, is disposed on the conductive pad 263 on the other side of the flip-chip package substrate 2b, for a circuit board (not shown) to be mounted thereon.

In an embodiment, the conductive element 28 comprises a solder material and/or a metal bump, such as a copper bump.

In an embodiment, the electronic component 90 is an active element, such as a semiconductor chip, a passive element, such as a resistor, a capacitor and an inductor, or a combination thereof. In another embodiment, electronic component 90 is electrically connected in a flip-chip manner to a circuit portion. In yet another embodiment, the electronic component 90 is disposed via the plurality of conductive elements 28 on the flip-chip package substrates 2a and 2b, and then an underfill 91 encapsulates the plurality of conductive elements 28. In still another embodiment, an encapsulation layer (not shown) encapsulates the electronic component 90. In an embodiment, the encapsulation layer is a thin film used in a compression process, an encapsulation resin used in a molding process, or a resin used in a printing process, and is made of polyimide (PI), a dry film, epoxy or an encapsulation material.

Figure 3A:
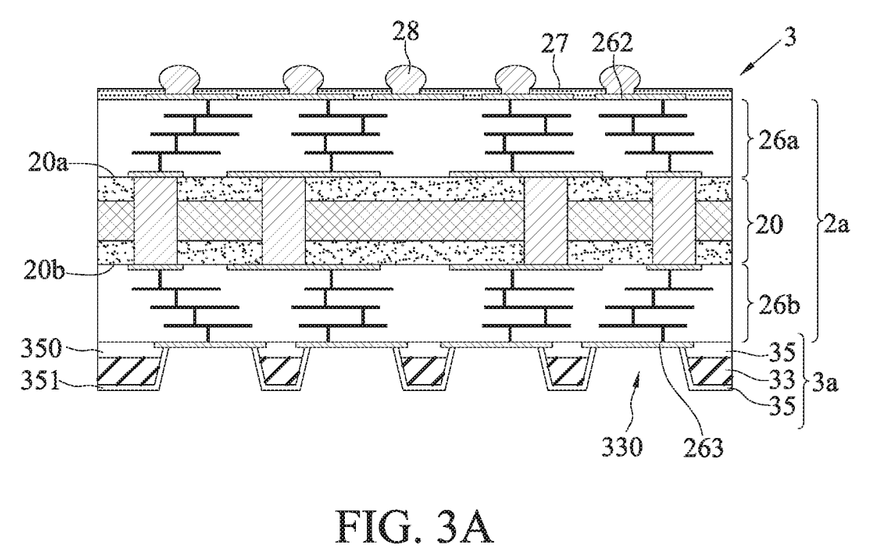
FIG. 3A is a cross-sectional view illustrating a method for fabricating a flip-chip package substrate of a second embodiment according to the present disclosure.
Figure 3B:
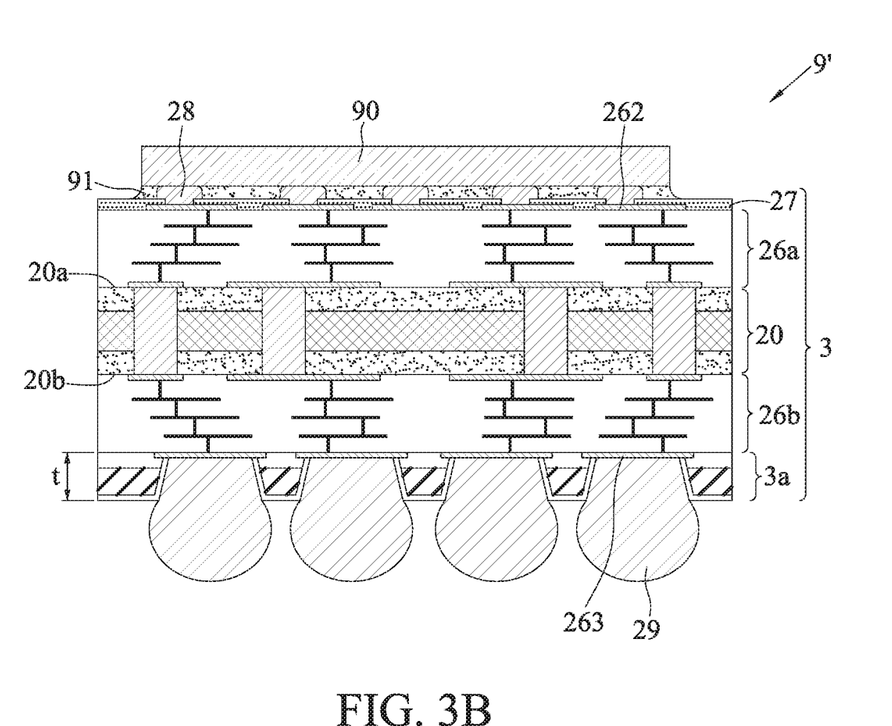
FIG. 3B is a cross-sectional view of an application of FIG. 3A.

FIGS. 3A and 3B are cross-sectional views illustrating a method for fabricating a flip-chip package substrate 3 of a second embodiment according to the present disclosure. The second embodiment differs from the first embodiment in the addition of a strengthening structure.

As shown in FIG. 3A, following the process shown in FIG. 2D, a strengthening structure 3a is disposed on the circuit structure 26b on the second side 20b of the core structure 20, and the insulation protection layer 27 is formed on the circuit structure 26a on the first side 20a of the core structure 20.

In an embodiment, the strengthening structure 3a comprises a rigid portion 33. In another embodiment, the rigid portion 33 is made of a highly rigid piece or board. In yet another embodiment, the rigid portion 33 is made of aluminum, aluminum alloy, stainless steel, copper, copper alloy, nickel iron alloy or other metal. In still another embodiment, the rigid portion 33 is made of highly rigid ceramic (e.g., $Al_2O_3$ or AlN), plastic, carbon fiber, or other insulative materials.

The strengthening structure 3a comprises an insulation portion 35 that encapsulates the rigid portion 33, and the rigid portion 33 is bonded via the insulation portion 35 onto the circuit structure 26b. In an embodiment, the insulation portion 35 comprises a bonding layer 350 bonded to the circuit structure 26b and a protection layer 351 encapsulating the rigid portion 33. In another embodiment, the insulation portion 35 (or the protection layer 351) is made of an organic dielectric material (e.g., a solder resist material) or an inorganic dielectric material (e.g., insulation oxide). In yet another embodiment, the organic dielectric material is made of ABF, prepreg, a molding compound, EMC, or primer. In still another embodiment, the bonding layer 350 and the protection layer 351 are made of the same or different materials.

A plurality of holes 330 are formed on the strengthening structure 3a, and the plurality of conductive pads 263 are exposed from the plurality of holes 330 for the conductive element 29 to be mounted thereon. In an embodiment, the strengthening structure 3a is formed by adhering the rigid portion 33 to the circuit structure 26b on the second side 20b via the insulation portion 35 (or the bonding layer 350), a plurality of holes 330 are formed on the insulation portion 25 for the conductive pads 263 to be exposed therefrom, and the protection layer 351 is formed on the rigid portion 33 and hole walls of the holes 330.

In an electronic package 9' shown in FIG. 3B, at least one electronic component 90 is mounted via the conductive element 28 on the conductive pads 262 on the other side of the flip-chip package substrate 3, and the conductive element 29, such as a solder ball, is mounted on the conductive pads 263 in the holes 330 of the strengthening structure 3a, for a circuit board (not shown) to be mounted thereon.

Therefore, the electronic package 9' can be electrically insulated between the rigid portion 33 made of metal and the conductive element 29 via the insulation portion 35 to prevent short circuit.

Figure 4A:
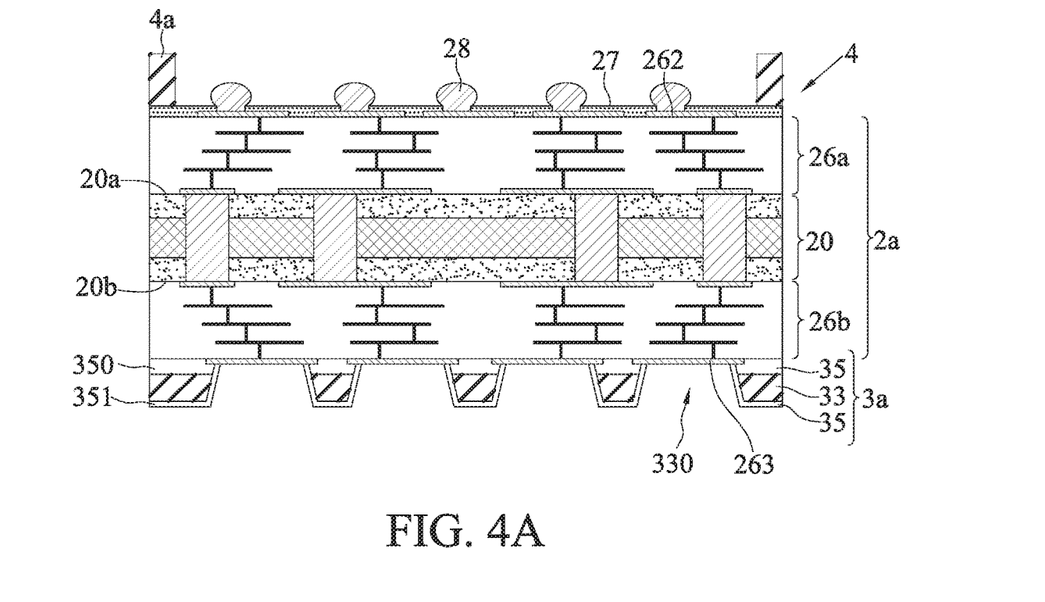
FIG. 4A is a cross-sectional view illustrating a method for fabricating a flip-chip package substrate of a third embodiment according to the present disclosure.
Figure 4B:
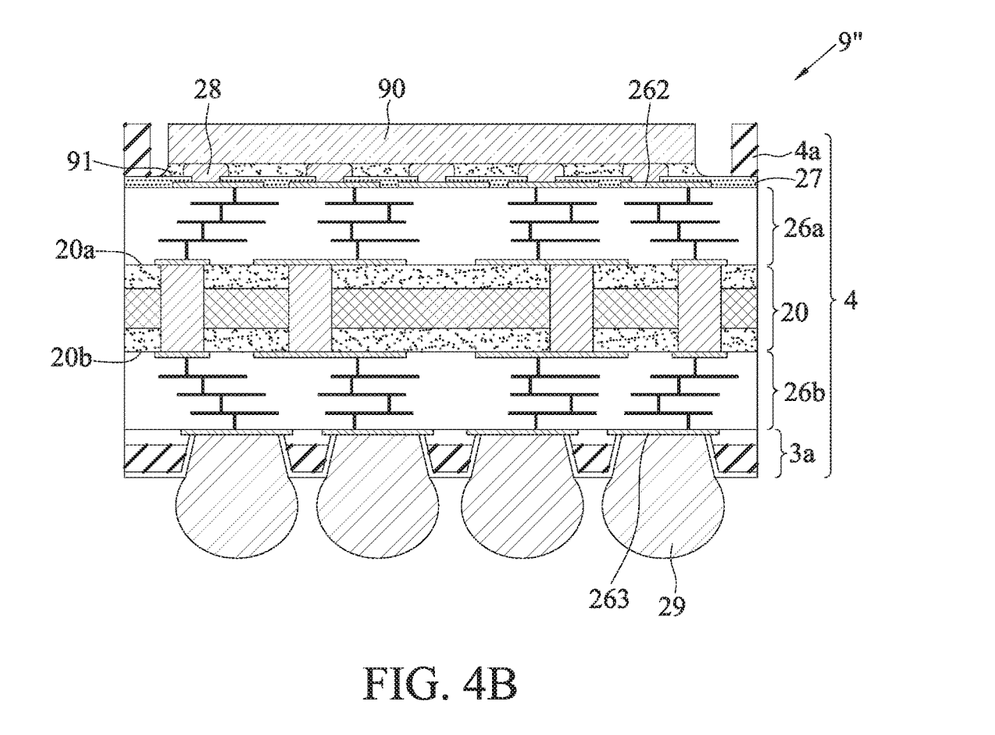
FIG. 4B is a cross-sectional view of an application of FIG. 4A.

FIGS. 4A and 4B are cross-sectional views illustrating a method for fabricating a flip-chip package substrate 4 of a third embodiment according to the present disclosure. The third embodiment differs from the second embodiment in the layout of a strengthening structure.

As shown in FIG. 4A, following the process shown in FIG. 2D, a strengthening structure 3a is disposed on the circuit structure 26b on the second side 20b of the core structure 20, the insulation protection layer 27 is formed on the circuit structure 26a on the first side 20a of the core structure 20, and another strengthening structure 4a is disposed on the insulation protection layer 27.

In an embodiment, the strengthening structure 4a is a frame made of a highly rigid material, for the plurality of conductive pads 262 or the conductive element 28 to be exposed therefrom. In an embodiment, the strengthening structure 4a is made of aluminum, aluminum alloy, stainless steel, copper, copper alloy, nickel iron alloy or other metal. In another embodiment, the strengthening structure 4a is made of a highly rigid ceramic (e.g., $Al_2O_3$ or AlN), plastic, carbon fiber, or other insulative materials.

In an electronic package 9" shown in FIG. 4B, at least one electronic component 90 is mounted via the conductive element 28 on the conductive pads 262 in the frame of the strengthening structure 4a, and the conductive element 29, such as a solder ball, is mounted on the conductive pads 263 in the holes 330 of the strengthening structure 3a, for a circuit board (not shown) to be mounted thereon.

Therefore, the strengthening structure 4a balances the stress distribution on the first side 20a and second side 20b of the core structure 20, to prevent the flip-chip package substrate 4 from warpage.

In the method according to the present disclosure, the insulation layers 22 and 23 are formed on two opposing sides of the middle layer 21, respectively, to form a strengthened composite core structure 20 and improve the rigidity of the flip-chip package substrates 2a, 2b, 3 and 4. Compared with the prior art, the flip-chip package substrates 2a, 2b, 3 and 4 according to the present disclosure, when applied to a highly integrated/large size packaging process of semiconductors, exhibit good enough rigidity, prevent warpage from occurrence during high temperature packaging process, and ensure its electrical connection with the semiconductor chip or circuit board.

The strengthened composite core structure 20 improves the rigidity of the flip-chip package substrates 2a, 2b, 3 and 4, so as to avoid the warpage problem in the semiconductor packaging process. Compared with the prior art, the flip-chip package substrates 2a, 2b, 3 and 4 can be fabricated thinner.

Since the flip-chip package substrates 2a, 2b, 3 and 4 are sufficiently rigid, it is not necessary to thicken the core structure 20. Therefore, the conductive structures 24 can have small end surfaces 24a and 24b, the circuit layout area of the circuit structure 26a and 26b is increased, and the number of the conductive pads 262 and 263 is increased accordingly.

The present disclosure also provides a flip-chip package substrate 2a, 2b, 3, 4, which comprises a core structure 20, a plurality of conductive structures 24, and a plurality of circuit structures 26a and 26b.

The core structure 20 has a first side 20a, a second side 20b opposing the first side 20a, a middle layer 21, and insulation layers 22 and 23 bonded on two opposing sides of the middle layer 21, respectively. In an embodiment, the middle layer 21 and the insulation layers 22 and 23 are made of different materials.

The conductive structures 24 penetrate the middle layer 21 and the insulation layers 22 and 23, and each of the conductive structures 24 is exposed from the first and second sides 20a and 20b of the core structure 20.

The circuit structures 26a and 26b are disposed in a dual-side built-up circuit manner on the first and second sides 20a and 20b of the core structure 20, respectively, and electrically connected to the conductive structures 24.

In an embodiment, the middle layer 21 of the core structure 20 is made of an insulative material, such as organic resin containing no glass fiber cloth, organic resin containing a filler (e.g., $SiO_2$ or glass fiber powder), and an insulative inorganic material (e.g., insulative oxide, nitride, an aluminum-containing material, or ceramic).

In an embodiment, the conductive structures 24, 54a and 5e-5h are composed of a single pillar.

In an embodiment, the conductive structures 24' and 54b-54d are composed of a plurality of pillars 240 and 540 stacked on one another, and the end surfaces of the plurality of pillars 240 and 540 are of the same or different sizes.

In an embodiment, the flip-chip package substrate 3, 4 further comprises a strengthening structure 3a, 4a disposed on the circuit structures 26a and 26b. The strengthening structure 3a comprises a rigid portion 33 that is made of a conductive material or an insulative material, and an insulation portion 35 encapsulating the rigid portion 33 and bonded to the circuit structure 26b. In an embodiment, the strengthening structure 4a is a frame.

In the flip-chip package substrate and the method for fabricating the same according to the present disclosure, the strengthened composite core structure is provided to improve the rigidity of the flip-chip package substrate. As the flip-chip package substrate according to the present disclosure is applied to a highly integrated/large size semiconductor packaging process, the problem that the package suffers from warpage is avoided.

The efficacy generated by the above-described feature according to the present disclosure is as follows.

Firstly, the flip-chip package substrate 2a, 2b, 3, 4 according to the present disclosure is highly rigid and can support the core structure 20 robustly. As the flip-chip package substrate 2a, 2b, 3, 4 is subject to the highly integrated/large size packaging process of the electronic package 9, 9', 9", the warpage is avoided, the flip-chip package substrate 2a, 2b, 3, 4 is in good connection with the electronic component 90 (the semiconductor chip 19 in the prior art) (e.g., the conductive element 28 or the solder material is connected) or with the circuit board (e.g., the conductive element 29 or the solder material is connected), and the electronic component 90 itself (the semiconductor chip 19 in the prior art) will not be broken due to the thermal stress, even if the CTEs of the layers are not consistent.

Secondly, since the flip-chip package substrate 2a, 2b, 3, 4 according to the present disclosure is highly rigid and can support the core structure 20 robustly, the flip-chip package substrate 2a, 2b, 3, 4 and the electronic package 9, 9', 9" including the flip-chip package substrate 2a, 2b, 3, 4 can be subject to the highly integrated/large size packaging process and be fabricated thinner.

Thirdly, since the core structure 20 according to the present disclosure can be fabricated thinner, the end surfaces 24a and 24b of the conductive structures 24 according to the present disclosure can be made smaller and have finer pitch accordingly.

Fourthly, since the conductive structures 24 according to the present disclosure can have finer pitch, the circuit layout of the circuit structure 26a, 26b is not so limited, and a highly dense circuit arrangement can be fabricated easily.

Fifthly, since the core structure 20 according to the present disclosure is made thinner, the height of the conductive structures 24 is not increased, the resistance is reduced, and the electric characteristics are improved.

Sixthly, since the core structure 20 according to the present disclosure is made thinner, the vias 200 in the core structure 20 can be processed easily and cheaply.

Seventhly, since the flip-chip package substrate 2a, 2b, 3, 4 according to the present disclosure is highly rigid and can support the core structure 20 robustly, the flip-chip package substrate 2a, 2b, 3, 4 and the electronic package 9, 9', 9" including the flip-chip package substrate 2a, 2b, 3, 4 can be made thinner, the electronic package 9, 9', 9" can dissipate heat efficiently, and the performance stability of the application end is ensured.

In the flip-chip package substrate 3, 4 according to the present disclosure, the strengthening structure 3a is disposed on the circuit structure 26b on the second side 20b of the core structure 20, the rigidity of the flip-chip package substrate 3, 4 is improved. Compared with the prior art, the flip-chip package substrate 3, 4 according to the present disclosure, when applied to a package of a large size, even if made thinner, can still be highly rigid, and the electronic package 9, 9', 9" can be prevented from warpage during high temperature packaging process and be in good connection with the electronic component 90 or a circuit board.

When the flip-chip package substrate 3, 4 is applied to a package of a large size (e.g., $55*55$ mm$^2$, $70*70$ mm$^2$, $80*80$ mm$^2$ etc.), the circuit structure 26a, 26b can be designed to have a desired number of layers, and the circuit structure 26a, 26b may generate various degrees of warpage. According to the present disclosure, the strengthening structure 3a, which has a thickness t (shown in FIG. 3B) and is made of a rigid material, can control the rigidity of the flip-chip package substrate 3, 4. Therefore, the core structure 20 needs not be made thicker and can even have a reduced thickness, and the flip-chip package substrate 3, 4 can still be prevented from warpage. Therefore, the end surfaces 24a and 24b of the conductive structures 24 can be made smaller, the circuit layout of the circuit layers 261 is not so limited, the circuit layers 261 of finer circuit and pitch can be fabricated, and the efficacy of highly dense packaging can be achieved.

Since the core structure 20 needs not to be made thicker and can have a reduced thickness, the conductive structures 24, if employing metal pillars, can reduce their resistance, increase their electric characteristics, and dissipate heat efficiently.

Since the core structure 20 can be made thinner, the conductive structures 24 can be processed more easily, and the electronic package 9', 9" and its flip-chip package substrate 3, 4 will have lower fabrication cost.

The efficacy generated by the strengthening structure 3a according to the present disclosure is as follows.

Firstly, since the flip-chip package substrate 3, 4 according to the present disclosure has the highly rigid strengthening structure 3a, the flip-chip package substrate 3, 4 and the electronic package 9', 9" including the flip-chip package substrate 3, 4 can be subject to a large size packaging process and be made thinner.

Secondly, since the core structure 20 according to the present disclosure can be made thinner, the aspect ratio between the diameter of the conductive structures 24 and the thickness of the core structure 20 is not increased, the vias 200 can be filled with a filler or electroplated with the conductive structures 24 easily, the conductive structures 24 can be processed easily, and the cost of the conductive structures 24 is reduced greatly.

Thirdly, since the core structure 20 according to the present disclosure is made thinner, the height of the conductive structures 24 is not increased, the resistance is reduced, and the electric characteristics are improved.

Fourthly, since the strengthening structure 3a has the thick rigid portion 33 and the core structure 20 is thin, the electronic package 9', 9" can dissipate heat efficiently and be unlikely to warpage due to the high temperature in a packaging process, and the application end can dissipate heat stably and efficiently. The strengthening structure 3a, when made of metal, can be grounded effectively, and the noises are reduced.

The foregoing descriptions of the detailed embodiments are only illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A flip-chip package substrate, comprising: a core structure having a first side, and a second side opposing the first side, and comprising a middle layer, and two insulation layers respectively bonded to two opposing sides of the middle layer and made of a different material from the middle layer; a plurality of conductive structures, each of which penetrating the middle layer and the insulation layers and being exposed from the first and second sides of the core structure; a circuit structure formed on the first and second sides of the core structure in a dual-side built-up circuit manner and electrically connected to the conductive structures; and a strengthening structure disposed on the circuit structure on at least one of the first side and the second side of the core structure, wherein the strengthening structure comprises a rigid portion and an insulation portion bonding the rigid portion onto the circuit structure.

2. The flip-chip package substrate of claim 1, wherein the middle layer of the core structure is made of an insulative material containing glass fiber.

3. The flip-chip package substrate of claim 2, wherein the insulative material is highly rigid Bismaleimide Triazine (BT) or flame retardant (FR-5).

4. The flip-chip package substrate of claim 1, wherein the insulation layer of the core structure is made of a highly rigid dielectric material.

5. The flip-chip package substrate of claim 4, wherein the highly rigid dielectric material is epoxy resin or Ajinomoto Build-up Film (ABF).

6. A method for fabricating a flip-chip package substrate, comprising: providing a middle layer; bonding an insulation layer onto two opposing sides of the middle layer, respectively, allowing the middle layer and the insulation layer to act as a core structure that has a first side and a second side opposing the first side, wherein the middle layer is made of a different material from the insulation layer; forming in the core structure a plurality of conductive structures, each of which penetrating the middle layer and the insulation layer and being exposed from the first and second sides of the core structure; forming on the first and second sides of the core structure a circuit structure in a dual-side built-up circuit manner, and electrically connecting the circuit structure to the conductive structures; and forming a strengthening structure on the circuit structure on at least one of the first side and the second side of the core structure, wherein the strengthening structure comprises a rigid portion and an insulation portion bonding the rigid portion onto the circuit structure.

7. The method of claim 6, wherein the middle layer of the core structure is made of an insulative material containing glass fiber.

8. The method of claim 7, wherein the insulative material is highly rigid Bismaleimide Triazine (BT) or flame retardant (FR-5).

9. The method of claim 6, wherein the insulation layer of the core structure is made of a highly rigid dielectric material.

10. The method of claim 9, wherein the highly rigid dielectric material is epoxy resin or Ajinomoto Build-up Film (ABF).

* * * * *